United States Patent
Sheng (10) Patent No.: US 11,867,497 B2
(45) Date of Patent: Jan. 9, 2024

(54) METHOD FOR MEASURING FILM THICKNESS OF SEMICONDUCTOR DEVICE

(71) Applicant: CHANGXIN MEMORY TECHNOLOGIES, INC., Hefei (CN)

(72) Inventor: Yongshang Sheng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 249 days.

(21) Appl. No.: 17/648,216

(22) Filed: Jan. 18, 2022

(65) Prior Publication Data
US 2022/0307818 A1 Sep. 29, 2022

Related U.S. Application Data (63) Continuation of application No. PCT/CN2021/112915, filed on Aug. 17, 2021.

(30) Foreign Application Priority Data

Mar. 29, 2021 (CN) .......................... 202110332821.5

(51) Int. Cl.
G01B 11/06 (2006.01)
G01N 21/21 (2006.01)
H01L 21/66 (2006.01)

(52) U.S. Cl.
CPC ........ *G01B 11/0625* (2013.01); *G01N 21/211* (2013.01); *G01N 2021/213* (2013.01); *H01L 22/12* (2013.01)

(58) Field of Classification Search
CPC .............. G01B 11/0625; G01N 21/211; G01N 2021/213; H01L 22/12
(Continued)

(56) References Cited

U.S. PATENT DOCUMENTS 6,310,688 B1 * 10/2001 Kao .................. G01B 11/0641
356/600
9,664,734 B2 5/2017 Malkova et al.
(Continued)

FOREIGN PATENT DOCUMENTS

CN 101865641 A 10/2010
CN 104778181 A 7/2015
(Continued)

OTHER PUBLICATIONS

International Search Report cited in PCT/CN2021/112915 dated Jan. 5, 2022, 11 pages.
(Continued)

*Primary Examiner* — Michael A Lyons
*Assistant Examiner* — Omar H Nixon
(74) *Attorney, Agent, or Firm* — Cooper Legal Group, LLC (57) ABSTRACT

The present disclosure discloses a method for measuring the film thickness of a semiconductor device. The measuring method includes: providing a reference spectrogram of a main storage region of a reference semiconductor device; obtaining a first measured spectrogram of a main storage region of a semiconductor device to be measured; adjusting a thickness parameter of a target film in the main storage region of the reference semiconductor device within a preset range based on the reference spectrogram, obtaining an adjusted reference spectrogram, and comparing the first measured spectrogram with the adjusted reference spectrogram; if the similarity between the first measured spectrogram and the adjusted reference spectrogram is greater than a first preset value, using the thickness parameter corresponding to the adjusted reference spectrogram as the thickness of the target film in the main storage region of the semiconductor device to be measured.

15 Claims, 3 Drawing Sheets

(58) Field of Classification Search
USPC .......................................................... 356/630
See application file for complete search history.

(56) References Cited

U.S. PATENT DOCUMENTS

| | | | |
|---|---|---|---|
| 10,365,085 B2 | 7/2019 | Wu et al. | |
| 10,399,203 B2 | 9/2019 | Kobayashi et al. | |
| 2005/0190381 A1* | 9/2005 | Mui | G01B 11/24 |
| | | | 257/E21.525 |
| 2010/0217430 A1* | 8/2010 | David | G05B 15/02 |
| | | | 700/160 |
| 2011/0282477 A1 | 11/2011 | Lee et al. | |
| 2014/0022564 A1 | 1/2014 | Yamada et al. | |
| 2015/0198434 A1 | 7/2015 | Chen et al. | |
| 2017/0190020 A1* | 7/2017 | Kobayashi | B24B 49/04 |

FOREIGN PATENT DOCUMENTS

| | | |
|---|---|---|
| CN | 106457507 A | 2/2017 |
| CN | 108050947 A | 5/2018 |
| CN | 109540007 A | 3/2019 |
| CN | 111276414 A | 6/2020 |
| CN | 111578852 A | 8/2020 |
| CN | 113091626 A | 7/2021 |
| TW | 201208812 A | 3/2012 |
| TW | 637448 B | 10/2018 |
| TW | I692629 B | 5/2020 |

OTHER PUBLICATIONS

First Office Action and English Translation cited in CN 202110332821.5, dated Feb. 25, 2022, 15 pages.

* cited by examiner

METHOD FOR MEASURING FILM THICKNESS OF SEMICONDUCTOR DEVICE

CROSS-REFERENCE TO RELATED APPLICATIONS

This is a continuation of International Application No. PCT/CN2021/112915, filed on Aug. 17, 2021, which claims the priority to Chinese Patent Application 202110332821.5, titled "METHOD FOR MEASURING FILM THICKNESS OF SEMICONDUCTOR DEVICE" and filed on Mar. 29, 2021. The entire contents of International Application No. PCT/CN2021/112915 and Chinese Patent Application 202110332821.5 are incorporated herein by reference.

TECHNICAL FIELD

The present disclosure relates to, but is not limited to, a method for measuring the film thickness of a semiconductor device.

BACKGROUND

A DRAM (Dynamic Random Access Memory) structure includes a storage region and a peripheral circuit region. For film thickness measurement, the traditional measuring method is to put some flat measure PADs on a scribe line and then simulate one-dimensional film structures of a main storage region and a peripheral circuit by means of stacking. In the existing detection method, the measure PADs cannot simulate the real structure and film thickness of the main storage region at some key sites. As a result, the measurement results are distorted, and the real film thickness of the main storage region cannot be actually and effectively monitored.

SUMMARY

The subject matter is described in detail herein below, which is not intended to limit the scope of protection of claims.

The present disclosure provides a method for measuring a film thickness of a semiconductor device, the semiconductor device including a substrate and a target film disposed on the substrate, the semiconductor device having a main storage region, the method including: providing a reference spectrogram of a main storage region of a reference semiconductor device; obtaining a first measured spectrogram of a main storage region of a semiconductor device to be measured; adjusting a thickness parameter of a target film in the main storage region of the reference semiconductor device within a preset range based on the reference spectrogram, obtaining an adjusted reference spectrogram, and comparing the first measured spectrogram with the adjusted reference spectrogram; if a similarity between the first measured spectrogram and the adjusted reference spectrogram is greater than a first preset value, using a thickness parameter corresponding to the adjusted reference spectrogram as a thickness of a target film in the main storage region of the semiconductor device to be measured; if the similarity between the first measured spectrogram and the adjusted reference spectrogram is less than the first preset value, continuing to adjust the thickness parameter of the target film in the main storage region of the reference semiconductor device within the preset range, until the similarity between the first measured spectrogram and the adjusted reference spectrogram is greater than the first preset value; wherein, the first preset value is greater than zero and less than or equal to 1.

After the drawings and detailed description are read and understood, other aspects may be understood.

BRIEF DESCRIPTION OF THE DRAWINGS

The drawings, which are incorporated in and constitute a part of the specification, illustrate embodiments of the present disclosure and together with the description serve to explain the principles of the embodiments of the present disclosure. In these drawings, similar reference numerals are used for representing similar elements. The drawings in the following description are only some rather than all of the embodiments of the present disclosure. Those skilled in the art would be able to derive other drawings from these drawings without any creative efforts.

DETAILED DESCRIPTION

A clear and complete description will be made to the technical solutions in the embodiments of the present disclosure below in combination with the drawings in the embodiments of the present disclosure. Apparently, the embodiments described are part of the embodiments of the present disclosure, not all of them. All other embodiments obtained by those skilled in the art based on the embodiments of the present disclosure without any creative efforts shall fall within the protection scope of the present disclosure. It should be noted that the embodiments in the present disclosure and the features in the embodiments can be combined with each other on a non-conflict basis.

Figure 1:
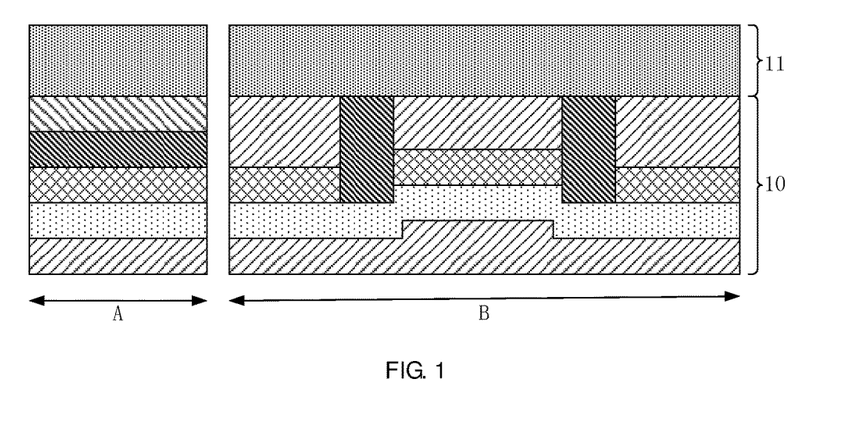
FIG. 1 is a schematic structure diagram of a semiconductor device.

FIG. 1 is a schematic structure diagram of a semiconductor device. Referring to FIG. 1, the semiconductor device includes a substrate 10 and a target film 11 disposed on the substrate 10. The target film 11 is a top film. The top film is a top layer of the semiconductor device after the current semiconductor device is formed and before the thickness of the target film of the semiconductor device is measured. After the thickness of the target film of the semiconductor device is measured, other films may also be formed on the target film, which is not limited in the present disclosure.

The semiconductor device has a main storage region B and a measurement region A. The main storage region B is an effective working region of the semiconductor device. The measurement region A is a measurement region, which is usually disposed on a scribe line. The film structure of the main storage region B is simulated in the measurement region A by means of film stacking, so that the actual three-dimensional film structure of the main storage region B is replaced with a one-dimensional film structure, which can directly realize film measurement of the main storage region B.

However, the inventor found, the film of the measurement region A is of a one-dimensional structure, while the film of the main storage region B is of a three-dimensional structure, which is more complex than the film structure of the measurement region A, so that the measurement region A is unable to accurately simulate the real structure and film thickness of the main storage region B, resulting in distortion of the measurement result.

The present disclosure provides a method for measuring the film thickness of a semiconductor device, which can actually and effectively monitor the real film thickness of the main storage region B.

Figure 2:
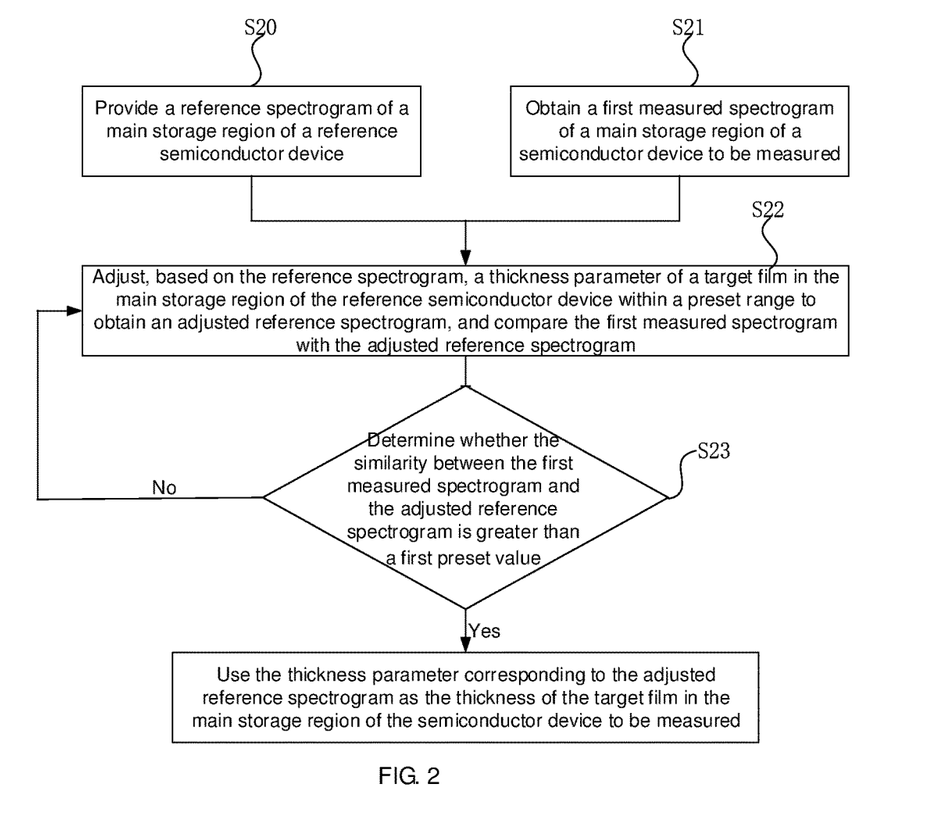
FIG. 2 is a schematic flowchart of a method for measuring the film thickness of a semiconductor device according to an embodiment of the present disclosure.

FIG. 2 is a schematic flowchart of a method for measuring the film thickness of a semiconductor device according to an embodiment of the present disclosure. Referring to FIG. 2, the method for measuring the film thickness of a semiconductor device includes:

Step S20, a reference spectrogram of a main storage region of a reference semiconductor device is provided.

In this embodiment, a reference semiconductor device is provided. The reference semiconductor device has the same structure as the semiconductor device shown in FIG. 1, so details are not described herein again. In this step, the reference spectrogram of the main storage region of the reference semiconductor device is an ellipsometric spectrum.

Step S21, a first measured spectrogram of a main storage region of a semiconductor device to be measured is obtained.

The semiconductor device to be measured is a semiconductor device whose thickness needs to be monitored. It has the same structure as the semiconductor device shown in FIG. 1 and the reference semiconductor device, so details are not described herein again. In this step, the first measured spectrogram of the main storage region of the semiconductor device to be measured is an ellipsometric spectrum, which may be obtained by the following method: placing the semiconductor device to be measured in a thickness measuring equipment (THK), and irradiating the main storage region with elliptically polarized light, to obtain the first measured spectrogram of the main storage region.

Step S22, a thickness parameter of the target film in the main storage region of the reference semiconductor device is adjusted within a preset range based on the reference spectrogram, to obtain an adjusted reference spectrogram, and the first measured spectrogram is compared with the adjusted reference spectrogram.

The reference spectrogram corresponds to a variety of data parameters, among which the thickness parameter is one of the data parameters, which can affect the shape of the reference spectrogram. The purpose of the present disclosure is to monitor the thickness of the target film in the main storage region of the semiconductor device to be measured. Therefore, in this step, the thickness parameter of the target film in the main storage region of the reference semiconductor device is adjusted within the preset range to obtain a reference spectrogram corresponding to the thickness parameter, and the adjusted reference spectrogram is used as a basis for subsequent comparison. The preset range may be determined according to the conventional thickness of the target film in the main storage region of the semiconductor device to be measured in the semiconductor process. For example, for a top silicon dioxide layer, its conventional thickness is 550 nm to 650 nm. Therefore, the preset range may be set to 500 nm to 700 nm to cover the entire thickness of the top silicon dioxide layer and improve the accuracy of the detection result.

Step S23, whether the similarity between the first measured spectrogram and the adjusted reference spectrogram is greater than a first preset value is determined; if the similarity between the first measured spectrogram and the adjusted reference spectrogram is greater than the first preset value, the thickness parameter corresponding to the adjusted reference spectrogram is used as the thickness of the target film in the main storage region of the semiconductor device to be measured; if the similarity between the first measured spectrogram of the main storage region of the semiconductor device to be measured and the adjusted reference spectrogram is less than the first preset value, the thickness parameter of the target film in the main storage region continues to be adjusted within the preset range, until the similarity between the first measured spectrogram of the main storage region of the semiconductor device to be measured and the adjusted reference spectrogram is greater than the first preset value.

The similarity between the first measured spectrogram and the adjusted reference spectrogram may refer to a degree of overlap or similarity between the first measured spectrogram and the adjusted reference spectrogram.

The first preset value is a value greater than zero and less than or equal to 1. In this embodiment, in order to improve the precision and accuracy of measurement and reduce the measurement error, the first preset value is 0.95, that is, in this embodiment, if the similarity between the first measured spectrogram and the adjusted reference spectrogram is greater than 0.95, the thickness parameter corresponding to the adjusted reference spectrogram is used as the thickness of the target film in the main storage region of the semiconductor device to be measured. In other embodiments of the present disclosure, the first preset value may also be other value, which may be determined according to the precision required by the semiconductor process. If the precision required by the semiconductor process is low, the first preset value may be appropriately reduced. If the precision required by the semiconductor process is high, the first preset value may be appropriately increased.

An example is listed below to clearly illustrate the execution process of steps S22 and S23.

The thickness parameter of the target film in the main storage region of the reference semiconductor device is adjusted to K1 within a preset range based on the reference spectrogram, to obtain a reference spectrogram corresponding to the thickness parameter K1.

The first measured spectrogram is compared with the reference spectrogram corresponding to the thickness parameter K1, and whether the similarity between the first measured spectrogram and the reference spectrogram corresponding to the thickness parameter K1 is greater than 0.95 is determined; if the similarity between the first measured spectrogram and the reference spectrogram corresponding to the thickness parameter K1 is greater than 0.95, the thickness parameter K1 is used as the thickness of the target film in the main storage region of the semiconductor device to be measured, and the measuring method is ended.

If the similarity between the first measured spectrogram of the main storage region of the semiconductor device to be measured and the reference spectrogram corresponding to the thickness parameter K1 is less than 0.95, the thickness parameter of the target film in the main storage region continues to be adjusted to K2 within the preset range, to obtain a reference spectrogram corresponding to the thickness parameter K2.

The first measured spectrogram is compared with the reference spectrogram corresponding to the thickness parameter K2, and whether the similarity between the first measured spectrogram and the reference spectrogram corresponding to the thickness parameter K2 is greater than 0.95 is determined; if the similarity between the first measured spectrogram and the reference spectrogram corresponding to the thickness parameter K2 is greater than 0.95, the thickness parameter K2 is used as the thickness of the target film in the main storage region of the semiconductor device to be measured, and the measuring method is ended.

If the similarity between the first measured spectrogram and the reference spectrogram corresponding to the thickness parameter K2 is less than 0.95, the thickness parameter of the target film in the main storage region continues to be adjusted within the preset range, until the similarity between the first measured spectrogram of the main storage region of the semiconductor device to be measured and the adjusted reference spectrogram is greater than 0.95.

In this embodiment, the substrate is a three-dimensional composite substrate in the main storage region. The three-dimensional composite substrate includes a silicon substrate and a plurality of films arranged on the silicon substrate. For example, the substrate is a silicon substrate, and the films include, but are not limited to, a silicon oxide layer, a silicon nitride layer, a polysilicon layer, a tungsten layer, a titanium nitride layer, a zirconium oxide layer, etc. In other embodiments of the present disclosure, the substrate may also be a one-dimensional substrate, which is also applicable to the measuring method of the present disclosure.

The three-dimensional composite substrate is not a one-dimensional structure. Due to the complexity of the three-dimensional composite substrate, it will affect the thickness measurement of the target film. The conventional thickness measuring method using the one-dimensional structure as a reference cannot obtain the real thickness of the target film. In the present disclosure, the reference semiconductor device and the semiconductor device to be measured have the same structures of the substrate and the target film. That is, if the reference semiconductor device has a one-dimensional substrate and a target film, the semiconductor device to be measured also has a one-dimensional substrate and a target film. If the reference semiconductor device has a three-dimensional substrate and a target film, the semiconductor device to be measured also has a three-dimensional substrate and a target film. Therefore, the real thickness of the target film of the semiconductor device to be measured can be obtained through the relationship between the reference spectrogram of the reference semiconductor device and the measured spectrogram of the semiconductor device to be measured, so as to actually and effectively monitor the real film thickness of the target film in the main storage region.

The embodiment of the present disclosure further provides a method for obtaining the reference spectrogram of the main storage region of the reference semiconductor device.

Figure 3:
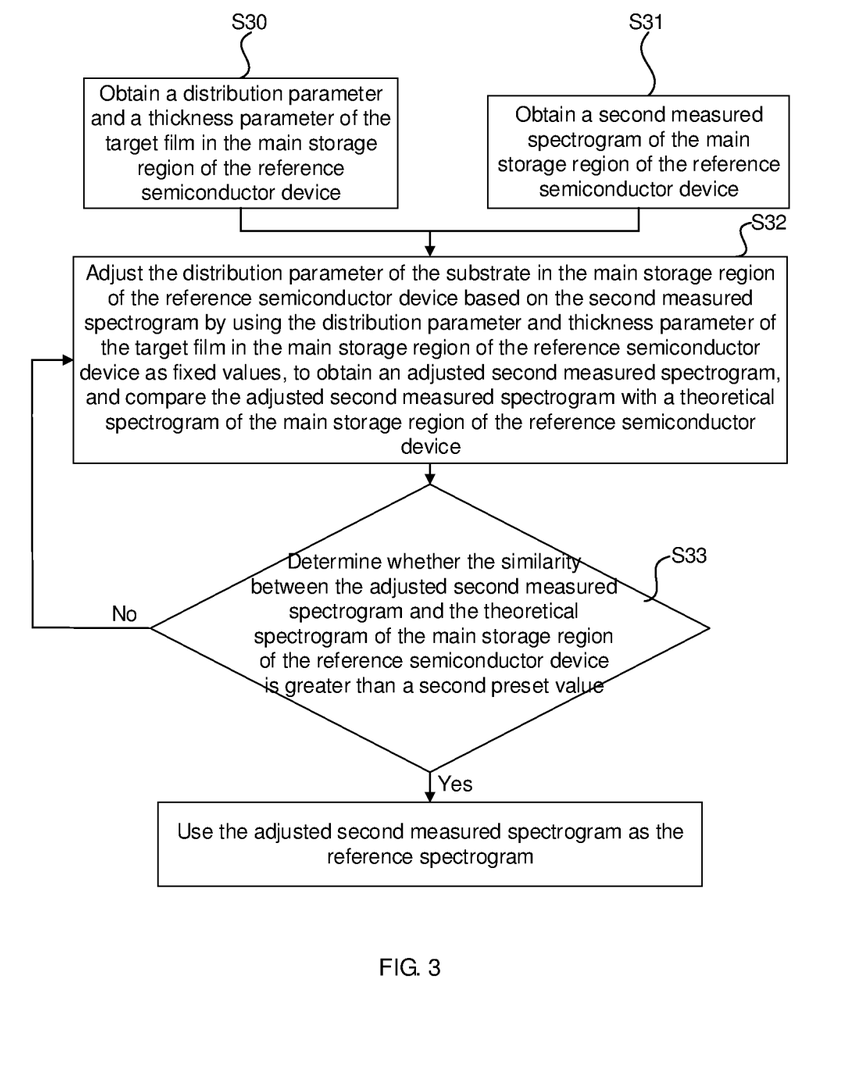
FIG. 3 is a schematic flowchart of a method for obtaining a reference spectrogram of a main storage region of a reference semiconductor device according to an embodiment of the present disclosure.

FIG. 3 is a schematic flowchart of a method for obtaining a reference spectrogram of the main storage region of the reference semiconductor device according to an embodiment of the present disclosure. Referring to FIG. 3, the method includes:

Step S30, a distribution parameter and a thickness parameter of the target film in the main storage region of the reference semiconductor device are obtained.

For each material, the distribution parameter of the material includes two parameters, namely N and K, where N represents a refractive index of the material, and K represents an extinction coefficient of the material. The two parameters will affect the spectrogram of the material.

Figure 4:
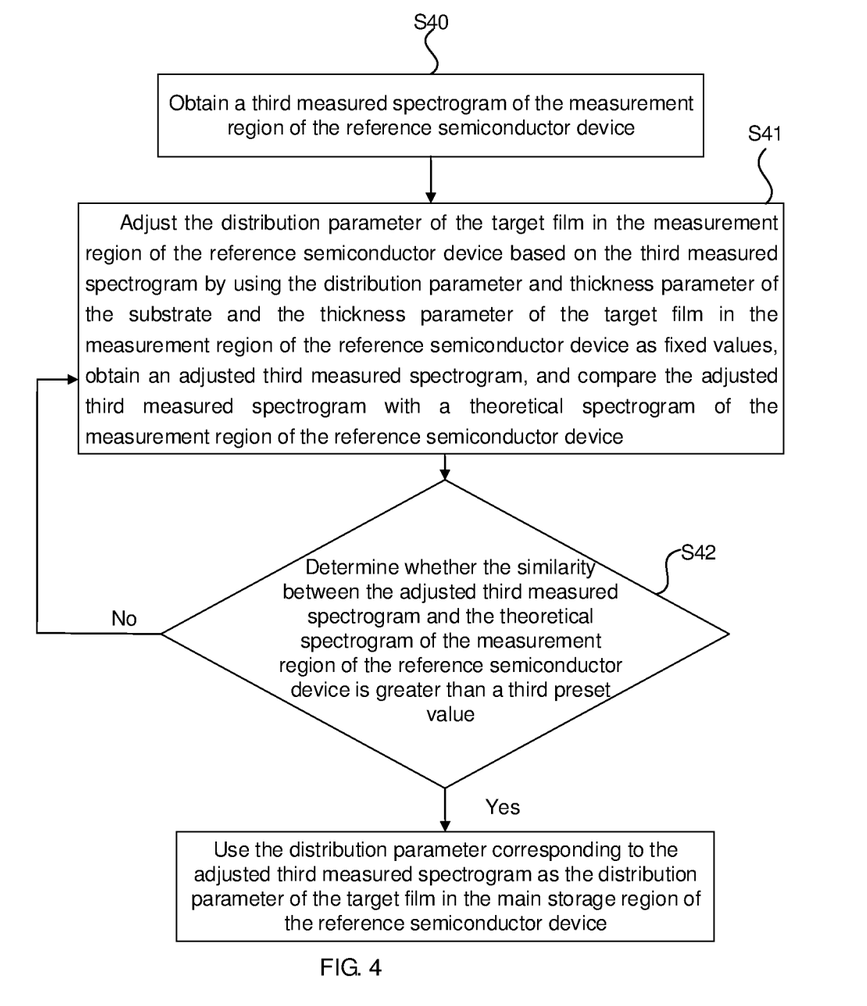
FIG. 4 is a schematic flowchart of a method for obtaining a distribution parameter of a target film in the main storage region of the reference semiconductor device according to an embodiment of the present disclosure.

This embodiment provides a method for obtaining the distribution parameter of the target film in the main storage region of the reference semiconductor device. In this embodiment, referring to FIG. 1, the reference semiconductor device also has a measurement region. The measurement region is formed by the same process as the main storage region. In the measurement region, the substrate has a one-dimensional structure. FIG. 4 is a schematic flowchart of a method for obtaining a distribution parameter of the target film in the main storage region of the reference semiconductor device according to an embodiment of the present disclosure. Referring to FIG. 4, the method includes:

Step S40, a third measured spectrogram of the measurement region of the reference semiconductor device is obtained.

The third measured spectrogram may be an ellipsometric spectrum, which may be obtained by the following method: placing the reference semiconductor device in the thickness measuring equipment (THK), and irradiating the measurement region with elliptically polarized light, to obtain the third measured spectrogram of the measurement region of the reference semiconductor device.

Step S41, the distribution parameter of the target film in the measurement region of the reference semiconductor device is adjusted based on the third measured spectrogram by using the distribution parameter and thickness parameter of the substrate and the thickness parameter of the target film in the measurement region of the reference semiconductor device as fixed values, to obtain an adjusted third measured spectrogram, and the adjusted third measured spectrogram is compared with a theoretical spectrogram of the measurement region of the reference semiconductor device.

The distribution parameter and thickness parameter of the substrate and the thickness parameter of the target film in the measurement region of the reference semiconductor device are known parameters. In an embodiment, since the substrate in the measurement region of the reference semiconductor device is a one-dimensional stack structure, its distribution parameter is known under the condition that other materials are known. Meanwhile, the thickness parameters of the substrate and the target film may be obtained during the manufacturing of the semiconductor device. In another embodiment of the present disclosure, the measurement region of the reference semiconductor device may also be sliced to expose a side surface of the measurement region of the reference semiconductor device; the thicknesses of the substrate and the target film are measured from the side surface of the measurement region of the reference semiconductor device as the thickness parameters of the substrate and the target film.

Because the distribution parameter is related to parameters of the spectrogram, such as a wavelength amplitude (Nosc), a peak appearance point (En), a wave width (Eg) and a phase difference (Nu), the distribution parameter can be adjusted by changing one or more of the wavelength amplitude, the peak appearance point, the wave width and the phase difference, to obtain the third measured spectrogram corresponding to the distribution parameter.

Step S42, whether the similarity between the adjusted third measured spectrogram and the theoretical spectrogram of the measurement region of the reference semiconductor device is greater than a third preset value is determined. If the similarity between the adjusted third measured spectrogram and the theoretical spectrogram of the measurement region of the reference semiconductor device is greater than the third preset value, the distribution parameter corresponding to the adjusted third measured spectrogram is used as the distribution parameter of the target film in the main storage region of the reference semiconductor device; if the similarity between the adjusted third measured spectrogram and the theoretical spectrogram of the measurement region of the reference semiconductor device is less than the third preset value, the distribution parameter of the target film in the measurement region of the reference semiconductor device continues to be adjusted, until the similarity between the adjusted third measured spectrogram and the theoretical spectrogram of the measurement region of the reference semiconductor device is greater than the third preset value.

The similarity between the adjusted third measured spectrogram and the theoretical spectrogram of the measurement region of the reference semiconductor device may refer to a degree of overlap or similarity between the adjusted third measured spectrogram and the theoretical spectrogram of the measurement region of the reference semiconductor device.

The third preset value is greater than zero and less than or equal to 1. In this embodiment, in order to improve the precision and accuracy of measurement and reduce the measurement error, the third preset value is 0.95. In other embodiments of the present disclosure, the third preset value may also be other value, which may be determined according to the precision required by the semiconductor process. If the precision required by the semiconductor process is low, the third preset value may be appropriately reduced. If the precision required by the semiconductor process is high, the third preset value may be appropriately increased.

An example is listed below to clearly illustrate the execution process of steps S41 and S42.

The distribution parameter of the target film in the measurement region of the reference semiconductor device is adjusted to NK1 based on the third measured spectrogram by using the distribution parameter and thickness parameter of the substrate and the thickness parameter of the target film in the measurement region of the reference semiconductor device as fixed values, to obtain a third measured spectrogram corresponding to the distribution parameter NK1.

The third measured spectrogram corresponding to the distribution parameter NK1 is compared with the theoretical spectrogram of the measurement region of the reference semiconductor device, to determine whether the similarity between the third measured spectrogram corresponding to the distribution parameter NK1 and the theoretical spectrogram of the measurement region of the reference semiconductor device is greater than 0.95, if yes, the distribution parameter NK1 is used as the distribution parameter of the target film in the main storage region of the reference semiconductor device, and the method is ended.

If not, the distribution parameter of the target film in the measurement region of the reference semiconductor device continues to be adjusted to NK2, to obtain a third measured spectrogram corresponding to the distribution parameter NK2.

The third measured spectrogram corresponding to the distribution parameter NK2 is compared with the theoretical spectrogram of the measurement region of the reference semiconductor device, to determine whether the similarity between the third measured spectrogram corresponding to the distribution parameter NK2 and the theoretical spectrogram of the measurement region of the reference semiconductor device is greater than 0.95, if yes, the distribution parameter NK2 is used as the distribution parameter of the target film in the main storage region of the reference semiconductor device, and the method is ended.

If not, the distribution parameter of the target film in the measurement region of the reference semiconductor device continues to be adjusted, until the similarity between the third measured spectrogram corresponding to the distribution parameter and the theoretical spectrogram of the measurement region of the reference semiconductor device is greater than 0.95.

The foregoing is only an embodiment of the method for obtaining the distribution parameter of the target film in the main storage region of the reference semiconductor device listed in the present disclosure. In other embodiments of the present disclosure, other methods may also be used to obtain the distribution parameter of the target film in the main storage region of the reference semiconductor device.

For step S30, this embodiment further provides a method for obtaining the thickness parameter of the main storage region of the reference semiconductor device: slicing the main storage region of the reference semiconductor device, to expose a side surface of the target film; and measuring the thickness of the target film from the side surface of the target film, to obtain the thickness parameter of the target film.

Continuing to refer to FIG. 3, step S31, a second measured spectrogram of the main storage region of the reference semiconductor device is obtained.

The second measured spectrogram may be an ellipsometric spectrum, which may be obtained by the following method: placing the reference semiconductor device in the thickness measuring equipment (THK), and irradiating the main storage region with elliptically polarized light, to obtain the second measured spectrogram of the main storage region of the reference semiconductor device. In this embodiment, since the second measured spectrogram and the third measured spectrogram are both spectrograms of the reference semiconductor device, the second measured spectrogram of the main storage region of the reference semiconductor device and the third measured spectrogram of the measurement region of the reference semiconductor device may be obtained in the same step. That is, the reference semiconductor device is placed in the thickness measuring equipment (THK), and the main storage region and the measurement region is irradiated with elliptically polarized light, thus obtaining the second measured spectrogram of the main storage region of the reference semiconductor device and the third measured spectrogram of the measurement region of the reference semiconductor device.

In other embodiments of the present disclosure, the second measured spectrogram of the main storage region of the reference semiconductor device and the third measured spectrogram of the measurement region of the reference semiconductor device may also be obtained in different steps.

Step S32, the distribution parameter of the substrate in the main storage region of the reference semiconductor device is adjusted based on the second measured spectrogram by using the distribution parameter and thickness parameter of the target film in the main storage region of the reference semiconductor device as fixed values, to obtain an adjusted second measured spectrogram, and the adjusted second measured spectrogram is compared with a theoretical spectrogram of the main storage region of the reference semiconductor device.

The distribution parameter and thickness parameter of the target film in the main storage region of the reference semiconductor device are obtained in step S30.

Because the distribution parameter of the substrate in the main storage region of the reference semiconductor device is related to parameters of the spectrogram, such as a wavelength amplitude (Nosc), a peak appearance point (En), a wave width (Eg) and a phase difference (Nu), the distribution parameter can be adjusted by changing one or more of the wavelength amplitude, the peak appearance point, the wave width and the phase difference.

Step S33, whether the similarity between the adjusted second measured spectrogram and the theoretical spectrogram of the main storage region of the reference semiconductor device is greater than a second preset value is determined. If the similarity between the adjusted second measured spectrogram and the theoretical spectrogram of the main storage region of the reference semiconductor device is greater than the second preset value, the adjusted second measured spectrogram is used as the reference spectrogram; if the similarity between the adjusted second measured spectrogram and the theoretical spectrogram of the main storage region of the reference semiconductor device is less than the second preset value, the distribution parameter of the substrate in the main storage region of the reference semiconductor device continues to be adjusted, until the similarity between the adjusted second measured spectrogram and the theoretical spectrogram of the main storage region of the reference semiconductor device is greater than the second preset value.

The similarity between the adjusted second measured spectrogram and the theoretical spectrogram of the main storage region of the reference semiconductor device may refer to a degree of overlap or similarity between the adjusted second measured spectrogram and the theoretical spectrogram of the main storage region of the reference semiconductor device.

The second preset value is greater than zero and less than or equal to 1. In this embodiment, in order to improve the precision and accuracy of measurement and reduce the measurement error, the second preset value is 0.95. In other embodiments of the present disclosure, the second preset value may also be other value, which may be determined according to the precision required by the semiconductor process. If the precision required by the semiconductor process is low, the second preset value may be appropriately reduced. If the precision required by the semiconductor process is high, the second preset value may be appropriately increased.

An example is listed below to clearly illustrate the execution process of steps S32 and S33.

The distribution parameter of the substrate in the main storage region of the reference semiconductor device is adjusted to NK01 based on the second measured spectrogram by using the distribution parameter and thickness parameter of the target film in the main storage region of the reference semiconductor device as fixed values, to obtain a second measured spectrogram corresponding to the distribution parameter NK01.

The second measured spectrogram corresponding to the distribution parameter NK01 is compared with the theoretical spectrogram of the main storage region of the reference semiconductor device, to determine whether the similarity between the second measured spectrogram corresponding to the distribution parameter NK01 and the theoretical spectrogram of the main storage region of the reference semiconductor device is greater than 0.95, and if yes, the second measured spectrogram corresponding to the distribution parameter NK01 is used as the reference spectrogram.

If not, the distribution parameter of the substrate in the main storage region of the reference semiconductor device continues to be adjusted to NK02, to obtain a second measured spectrogram corresponding to the distribution parameter NK02.

The second measured spectrogram corresponding to the distribution parameter NK02 is compared with the theoretical spectrogram of the main storage region of the reference semiconductor device, to determine whether the similarity between the second measured spectrogram corresponding to the distribution parameter NK02 and the theoretical spectrogram of the main storage region of the reference semiconductor device is greater than 0.95, and if yes, the second measured spectrogram corresponding to the distribution parameter NK02 is used as the reference spectrogram.

If not, the distribution parameter of the substrate in the main storage region of the reference semiconductor device continues to be adjusted, until the similarity between the adjusted second measured spectrogram and the theoretical spectrogram of the main storage region of the reference semiconductor device is greater than 0.95.

The foregoing is only an example of obtaining the reference spectrogram of the main storage region of the reference semiconductor device listed in the present disclosure. In other embodiments of the present disclosure, other methods may be used to obtain the reference spectrogram of the main storage region of the reference semiconductor device.

In an embodiment of the present disclosure, the substrate is a collection of all films below the target film, and its distribution parameter is very different from that of the common silicon substrate. Therefore, the distribution parameter of the silicon substrate cannot be directly used to obtain the thickness of the target film of the semiconductor device. In the method for obtaining the reference spectrogram in the present disclosure, the distribution parameter and thickness parameter of the target film in the main storage region of the reference semiconductor device are fixed to deduce the distribution parameter of the corresponding substrate inversely, different second measured spectrograms are obtained by adjusting the distribution parameter of the substrate in the main storage region of the reference semiconductor device, and a reference spectrogram is obtained according to the relationship between the second spectrogram and the theoretical spectrogram of the main storage region of the reference semiconductor device, so that the real thickness of the target film of the semiconductor device to be measured can be obtained according to the reference spectrogram.

The inventor found, for the same semiconductor device, its edge and center spectrograms may be different. In step S32, if the distribution parameter is adjusted based on only the edge or center substrate, the measurement may be inaccurate. Therefore, the present disclosure provides an embodiment.

In this embodiment, before step S32 is executed, the following step is executed: obtaining distribution parameters of the substrate in different zones of the main storage region of the reference semiconductor device, for example, distribution parameters of the substrate at the edge and center of the semiconductor device, or distribution parameters of the substrate at the edge, middle part, and center of the semiconductor device. The different zones of the main storage region of the reference semiconductor device may be set according to actual requirements, which is not limited in the present disclosure.

The distribution parameters of the substrate in the zones are integrated to obtain a reference distribution parameter.

The integration may be carried out through a conventional method, for example, through a BEAM model in OLSA software.

Then, when step S32 is executed, the reference distribution parameter is adjusted based on the second measured spectrogram by using the distribution parameter and thickness parameter of the target film in the main storage region of the reference semiconductor device as fixed values, to obtain an adjusted second measured spectrogram, which is compared with the theoretical spectrogram of the main storage region of the reference semiconductor device, thereby avoiding the regional influence of the semiconductor device.

The embodiments or implementations in this specification are described in a progressive manner, each embodiment focuses on the differences from other embodiments, and the same or similar parts between the various embodiments may be referred to each other.

In the description of this specification, the descriptions with reference to the terms "embodiment", "exemplary embodiment", "some implementations", "schematic implementation", "example", etc. mean that specific features, structures, materials or characteristics described in conjunction with the embodiments or examples are included in at least one embodiment or example of the present disclosure.

In this specification, the schematic descriptions of the above terms do not necessarily refer to the same embodiment or example. Moreover, the described specific features, structures, materials or characteristics may be combined in an appropriate manner in any one or more embodiments or examples.

In the description of the present disclosure, it should be noted that the orientations or positional relationships indicated by the terms "center", "upper", "lower", "left", "right", "vertical", "horizontal", "inner", "outer", etc. are based on the orientations or positional relationships shown in the accompanying drawings, and are intended to facilitate the description of the present disclosure and simplify the description only, rather than indicating or implying that the device or element referred to must have a particular orientation or be constructed and operated in a particular orientation, and will not to be interpreted as limiting the present disclosure.

It can be understood that the terms "first", "second", etc. used in the present disclosure can be used in the present disclosure to describe various structures, but these structures are not limited by these terms. These terms are only used to distinguish the first structure from another structure.

In one or more drawings, the same elements are represented by similar reference numerals. For the sake of clarity, various parts in the drawings are not drawn to scale. In addition, some well-known parts may not be shown. For the sake of brevity, the structure obtained after several steps can be described in one figure. Many specific details of the present disclosure are described below, such as the structure, material, dimension, treatment process and technology of devices, in order to understand the present disclosure more clearly. However, as those skilled in the art can understand, the present disclosure may not be implemented according to these specific details.

Finally, it should be noted that the above embodiments are merely used to describe, but not to limit, the technical solutions of the present disclosure. Although the present disclosure is described in detail with reference to the above embodiments, those of ordinary skill in the art should understand that various modifications may be made to the technical solutions described in the foregoing embodiments, or equivalent substitutions may be made to some or all technical features thereof, and these modifications or substitutions do not make the essences of the corresponding technical solutions depart from the scope of the technical solutions of the embodiments of the present disclosure.

INDUSTRIAL APPLICABILITY

In the method for measuring the film thickness of a semiconductor device provided by the embodiments of the present disclosure, the reference semiconductor device and the semiconductor device to be measured have the same structures of the substrate and the target film. Therefore, the real thickness of the target film of the semiconductor device to be measured can be obtained through the relationship between the reference spectrogram of the reference semiconductor device and the measured spectrogram of the semiconductor device to be measured, so as to actually and effectively monitor the real film thickness of the target film in the main storage region.

The invention claimed is:

1. A method for measuring a film thickness of a semiconductor device, the semiconductor device comprising a substrate and a target film disposed on the substrate, the semiconductor device having a main storage region, the method comprising:
   providing a reference spectrogram of a main storage region of a reference semiconductor device;
   obtaining a first measured spectrogram of a main storage region of a semiconductor device to be measured;
   adjusting a thickness parameter of a target film in the main storage region of the reference semiconductor device within a preset range based on the reference spectrogram, obtaining an adjusted reference spectrogram, and comparing the first measured spectrogram with the adjusted reference spectrogram;
   when a similarity between the first measured spectrogram and the adjusted reference spectrogram is greater than a first preset value, using a thickness parameter corresponding to the adjusted reference spectrogram as a thickness of a target film in the main storage region of the semiconductor device to be measured; and
   when the similarity between the first measured spectrogram and the adjusted reference spectrogram is less than the first preset value, continuing to adjust the thickness parameter of the target film in the main storage region of the reference semiconductor device within the preset range, until the similarity between the first measured spectrogram and the adjusted reference spectrogram is greater than the first preset value;
   wherein, the first preset value is greater than zero and less than or equal to 1.

2. The method for measuring a film thickness of a semiconductor device according to claim 1, wherein the first preset value is greater than 0.95.

3. The method for measuring a film thickness of a semiconductor device according to claim 1, wherein, in the main storage region, the substrate is a three-dimensional composite substrate.

4. The method for measuring a film thickness of a semiconductor device according to claim 3, wherein the three-dimensional composite substrate comprises a silicon substrate and a plurality of films arranged on the silicon substrate.

5. The method for measuring a film thickness of a semiconductor device according to claim 3, further comprising a method for obtaining the reference spectrogram of the main storage region of the reference semiconductor device, the method comprising:

obtaining a distribution parameter and the thickness parameter of the target film in the main storage region of the reference semiconductor device;

obtaining a second measured spectrogram of the main storage region of the reference semiconductor device;

adjusting a distribution parameter of a substrate in the main storage region of the reference semiconductor device based on the second measured spectrogram by using the distribution parameter and thickness parameter of the target film in the main storage region of the reference semiconductor device as fixed values, obtaining an adjusted second measured spectrogram, and comparing the adjusted second measured spectrogram with a theoretical spectrogram of the main storage region of the reference semiconductor device;

when a similarity between the adjusted second measured spectrogram and the theoretical spectrogram of the main storage region of the reference semiconductor device is greater than a second preset value, using the adjusted second measured spectrogram as the reference spectrogram; and when the similarity between the adjusted second measured spectrogram and the theoretical spectrogram of the main storage region of the reference semiconductor device is less than the second preset value, continuing to adjust the distribution parameter of the substrate in the main storage region of the reference semiconductor device, until the similarity between the adjusted second measured spectrogram and the theoretical spectrogram of the main storage region of the reference semiconductor device is greater than the second preset value;

wherein, the second preset value is greater than zero and less than or equal to 1.

6. The method for measuring a film thickness of a semiconductor device according to claim 5, wherein the second preset value is greater than 0.95.

7. The method for measuring a film thickness of a semiconductor device according to claim 5, wherein the reference semiconductor device also has a measurement region, the measurement region is formed by a same process as the main storage region, and a substrate has a one-dimensional structure in the measurement region; wherein the obtaining a distribution parameter of the target film in the main storage region of the reference semiconductor device comprises:

obtaining a third measured spectrogram of the measurement region of the reference semiconductor device;

adjusting a distribution parameter of a target film in the measurement region of the reference semiconductor device based on the third measured spectrogram by using a distribution parameter and a thickness parameter of the substrate and a thickness parameter of the target film in the measurement region of the reference semiconductor device as fixed values, obtaining an adjusted third measured spectrogram, and comparing the adjusted third measured spectrogram with a theoretical spectrogram of the measurement region of the reference semiconductor device;

when a similarity between the adjusted third measured spectrogram and the theoretical spectrogram of the measurement region of the reference semiconductor device is greater than a third preset value, using the distribution parameter corresponding to the adjusted third measured spectrogram as the distribution parameter of the target film in the main storage region of the reference semiconductor device; and when the similarity between the adjusted third measured spectrogram and the theoretical spectrogram of the measurement region of the reference semiconductor device is less than the third preset value, continuing to adjust the distribution parameter of the target film in the measurement region of the reference semiconductor device, until the similarity between the adjusted third measured spectrogram and the theoretical spectrogram of the measurement region of the reference semiconductor device is greater than the third preset value;

wherein, the third preset value is greater than zero and less than or equal to 1.

8. The method for measuring a film thickness of a semiconductor device according to claim 7, wherein the third preset value is greater than 0.95.

9. The method for measuring a film thickness of a semiconductor device according to claim 7, wherein in the adjusting a distribution parameter of a target film in the measurement region of the reference semiconductor device based on the third measured spectrogram by using a distribution parameter and a thickness parameter of the substrate and a thickness parameter of the target film in the measurement region of the reference semiconductor device as fixed values, obtaining an adjusted third measured spectrogram, and comparing the adjusted third measured spectrogram with a theoretical spectrogram of the measurement region of the reference semiconductor device, the distribution parameter and thickness parameter of the substrate and the thickness parameter of the target film in the measurement region of the reference semiconductor device are known parameters.

10. The method for measuring a film thickness of a semiconductor device according to claim 7, wherein in the adjusting a distribution parameter of a target film in the measurement region of the reference semiconductor device based on the third measured spectrogram by using a distribution parameter and a thickness parameter of the substrate and a thickness parameter of the target film in the measurement region of the reference semiconductor device as fixed values, obtaining an adjusted third measured spectrogram, and comparing the adjusted third measured spectrogram with a theoretical spectrogram of the measurement region of the reference semiconductor device, a method for obtaining the thickness parameter of the substrate and the thickness parameter of the target film in the measurement region of the reference semiconductor device comprises:

slicing the measurement region of the reference semiconductor device, to expose a side surface of the measurement region of the reference semiconductor device; and measuring thicknesses of the substrate and the target film from the side surface of the measurement region of the reference semiconductor device as the thickness parameters of the substrate and the target film.

11. The method for measuring a film thickness of a semiconductor device according to claim 5, wherein the obtaining the thickness parameter of the target film in the main storage region of the reference semiconductor device comprises:

slicing the main storage region of the reference semiconductor device, to expose a side surface of the target film; and measuring a thickness of the target film from the side surface of the target film, to obtain the thickness parameter of the target film.

12. The method for measuring a film thickness of a semiconductor device according to claim 5, wherein the adjusting a distribution parameter of a substrate in the main storage region of the reference semiconductor device based on the second measured spectrogram by using the distribution parameter and thickness parameter of the target film in the main storage region of the reference semiconductor device as fixed values, obtaining an adjusted second measured spectrogram, and comparing the adjusted second measured spectrogram with a theoretical spectrogram of the main storage region of the reference semiconductor device comprises:

obtaining distribution parameters of the substrate in different zones of the main storage region of the reference semiconductor device;

integrating the distribution parameters of the substrate in the zones and obtaining a reference distribution parameter; and adjusting the reference distribution parameter based on the second measured spectrogram by using the distribution parameter and thickness parameter of the target film in the main storage region of the reference semiconductor device as fixed values, obtaining the adjusted second measured spectrogram, and comparing the adjusted second measured spectrogram with the theoretical spectrogram of the main storage region of the reference semiconductor device.

13. The method for measuring a film thickness of a semiconductor device according to claim 5, wherein the distribution parameter comprises a refractive index and an extinction coefficient of a material.

14. The method for measuring a film thickness of a semiconductor device according to claim 13, wherein the distribution parameter is adjusted by changing one or more of a wavelength amplitude, a peak appearance point, a wave width and a phase difference.

15. The method for measuring a film thickness of a semiconductor device according to claim 1, wherein the target film is a top film.

* * * * *